United States Patent [19]
Licata et al.

[11] Patent Number: 5,874,201
[45] Date of Patent: Feb. 23, 1999

[54] DUAL DAMASCENE PROCESS HAVING TAPERED VIAS

[75] Inventors: Thomas John Licata, Lagrangeville; Ronald Wayne Nunes, Hopewell Junction; Motoya Okazaki, Fishkill, all of N.Y.

[73] Assignee: International Business Machines Corporation, Armonk, N.Y.

[21] Appl. No.: 461,813

[22] Filed: Jun. 5, 1995

[51] Int. Cl.⁶ ........................................... G03F 7/26
[52] U.S. Cl. .................. 430/314; 430/316; 156/644.1; 156/659.11; 216/46
[58] Field of Search ...................... 430/313, 316, 430/314; 156/644.1, 659.11; 216/46

[56] References Cited

U.S. PATENT DOCUMENTS

| | | | |
|---|---|---|---|
| 4,461,672 | 7/1984 | Musser | 156/644 |
| 4,758,305 | 7/1988 | Bonifield et al. | 156/643 |
| 4,902,377 | 2/1990 | Berglund et al. | 156/643 |
| 5,171,412 | 12/1992 | Talieh et al. | 204/192.15 |
| 5,308,742 | 5/1994 | Ta | 430/313 |

FOREIGN PATENT DOCUMENTS 0 529 321 A1 3/1993 European Pat. Off. .
60-261141 A 12/1995 Japan .

*Primary Examiner*—Kathleen Duda

[57] ABSTRACT

A process for forming a dual-damascene interconnect employs a spun-on organic layer above an interlayer dielectric having a set of apertures for vias that forms tapered regions about the apertures without penetrating the apertures; the slope of the tapered regions being transferred in the etching process to form self-aligned tapered vias.

7 Claims, 3 Drawing Sheets

DUAL DAMASCENE PROCESS HAVING TAPERED VIAS

TECHNICAL FIELD

The field of the invention is that of processing integrated circuits, in particular forming metal interconnections with Damascene technology (meaning a process in which the conductor is embedded in the dielectric and the tops of the conductor and the dielectric are polished to a common surface).

BACKGROUND ART

In integrated circuit processing, vertical connecting members (vias) between horizontal interconnection layers are used to improve planarity. The apertures that are formed have a high aspect ratio and are correspondingly difficult to fill without voids.

U.S. Pat. No. 5,173,442 illustrates a Damascene process that employs a two-level mask. U.S. Pat. No. 5,004,673 illustrates a Damascene process employing a mask of graded thickness at various locations.

U.S. Pat. No. 4,461,672 illustrates a Damascene process in which a sacrificial polysilicon layer is isotropically etched to produce a tapered opening, the taper being transferred to an underlying oxide layer. The art has long searched for a simple, low cost method of forming a Damascene-metal interconnect.

SUMMARY OF THE INVENTION

The invention relates to a method of forming a dual Damascene interconnect having a Damascene layer embedded within an interlayer dielectric and positioned above a via connecting to an underlying layer in which a layer of organic anti-reflective coating is deposited and spun on to a dielectric layer, and in which the surface tension of the organic layer forms a tapered rim region about vias that have previously been etched into the underlying dielectric. The taper of the organic layer is then transferred into the underlying process oxide by the effect of the differential etch resistance of oxide and polymer, thereby forming a tapered via with a lower aspect ratio that is easier to fill.

DETAILED DESCRIPTION OF THE INVENTION

Figure 1A:
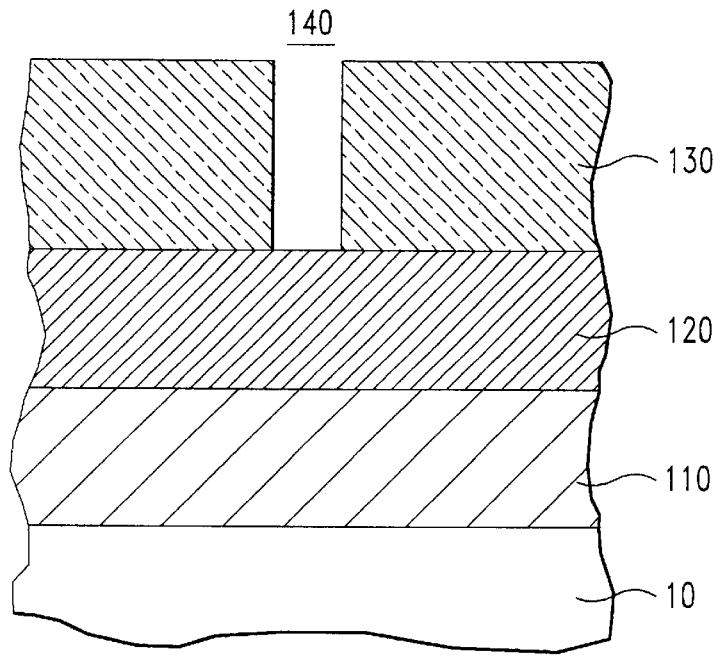
FIG. 1a through 1c illustrate a portion of an integrated circuit at various steps of the invention.

Referring now to FIG. 1A, there is shown a substrate 10 over which an oxide or other insulating layer 110 is formed. A first level of metal (illustratively aluminum) interconnect 120 extends from left to right in the drawing. Above layer 120, a layer of oxide ($SiO_2$) 130 having a nominal thickness of between 200 nm and 300 nm has been put down and etched in a standard, non-isotropic etch process $CF_4/O_2$ chemistry as the etchant to form aperture 140 extending down to and stopping on metal 120.

Figure 1B:
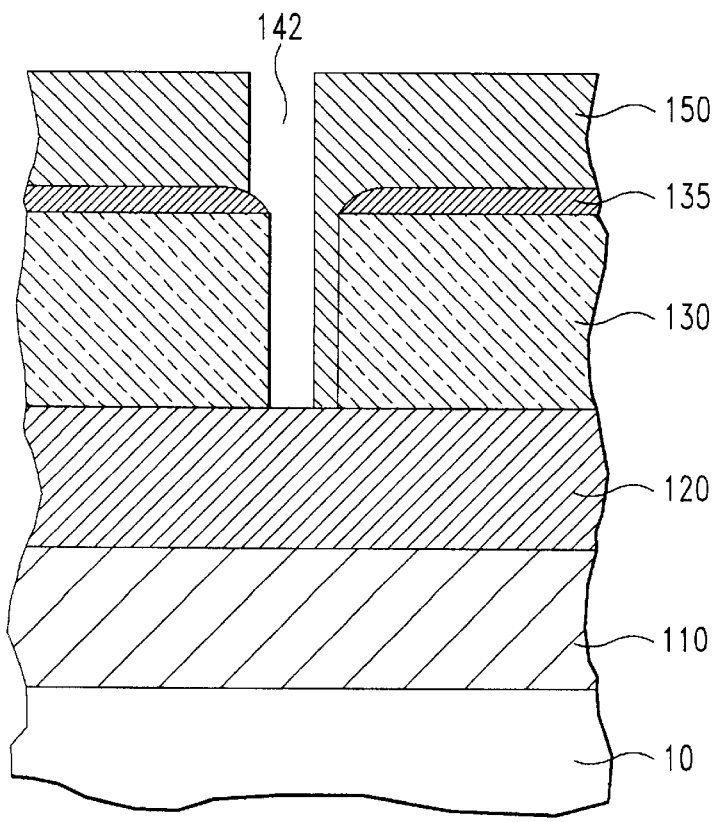

In FIG. 1B, the same location is shown after a layer—of anti-reflective coating (ARC) 135, such as that illustrated in U.S. Pat. No. 5,294,680, has been put down and spun on to a nominal thickness of 90 nm. Those skilled in the art would expect that the spinning process and deposition process would result in the penetration of aperture 140 by some of layer 135, but it has been found that this does not happen. In a layer according to the invention, the surface tension of layer 135 both prevents the material in the layer from getting into aperture 140, and also serves to form a tapered rim region from the edge of aperture 140 to the average level of layer 135. The tapered region about the via has a slope that will be referred to as the rim slope. After baking layer 135 at 225° C., a layer of resist 150 is deposited, exposed, and developed to form aperture 142.

Aperture 142 is shown as misaligned in order to highlight an aspect of the invention that will be discussed with respect to FIG. 4A and 4B. As is conventional, aperture 140 extends perpendicular to the plane of the paper by a much smaller amount than the damascene conductor, which must reach another node of the circuit that may be far away.

Figure 1C:
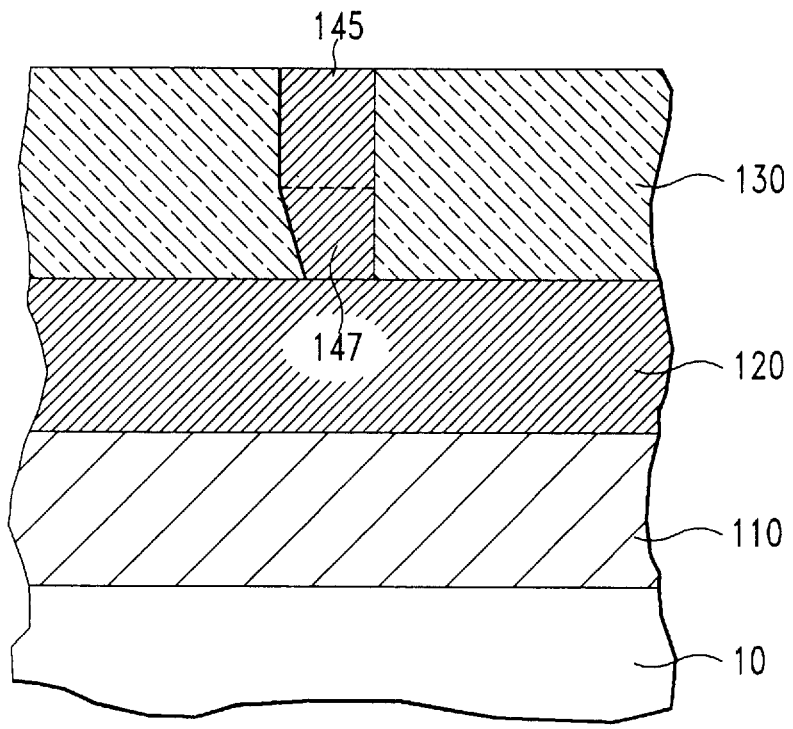

FIG. 1C, the result of a non-isotropic etch using $CF_4/O_2$ chemistry as an etching gas in an insulator etching system, has been performed and resist 150 and ARC layer 135 have been stripped. The result is an aperture having a tapered bottom section that has been filled with metal and polished to become level with the top of oxide 130. The via is designated with the numeral 147 and the Damascene interconnect is denoted with the numeral 145. Interconnect 145 extends perpendicular to the plane of the paper to connect with some other node in the circuit. The taper of the via is shown at a steeper angle (having a larger via slope) than the taper of ARC 135 because the taper is magnified by the differential effect of the etchant on the ARC and on the oxide. In the example illustrated, the etch resistance is in the ratio of 3:1 so the oxide etches much faster at the edge of aperture 142 than it does where the ARC is thicker. The amount of taper can be adjusted by modifying the selectivity of the etch process as is known in the art. For example, the parameters of the plasma, the etchant chemistry and/or the ARC composition may be changed.

The advantages of a tapered via—that of a lower aspect ratio to be filled by the subsequent metal deposition process—are well known and need not be repeated here. the embodiment illustrated, aperture 140 had a nominal width of 300 nm and layer 135 illustratively a conventional bottom anti-reflective layer (BARL) had a thickness of 90 nm. The BARL layer will form droplets of a characteristic size dependent on at least the surface tension of the material and the wettability of the surface. If the characteristic size is considerably smaller than the aperture, it will be relatively easy for droplets to penetrate the aperture. Those skilled in the art will readily be able to select coating of appropriate viscosity and surface tension to avoid penetration and to achieve a desired taper in a rim about aperture 140. As noted above, the taper of the via can be adjusted by altering the selectivity of the etching parameters in a conventional manner. The nominal thickness of oxide 130 was 900nm and the nominal thickness of damascene interconnect 145 was 500 nm. The wafer was degassed at 350° C. for one minute in order to reduce later outgassing in the high temperature Al deposition step. A layer of 20 nm of Ti was deposited through a collimator having an aspect ratio of 1.5 in order to provide better fill of the high aspect via. The wafer was cooled for one minute by a flow of Ar to prevent agglomeration of the Ti layer. The wafer is transferred to a module of the tool where 150 nm of Al are deposited at 50° C. using a collimator having an aspect ratio of 1.5, followed by the deposition of 550 nm of Al at a temperature than 450° C. and preferably 525° C. without the use of a collimator, after which the wafer is actively cooled in a separate cooling station. The use of a hot-Al deposition technique produces a mean Al grain size of about 0.2 $\mu$m, so that there are few grain boundaries in a wire having a nominal dimension of 0.25 $\mu$m. Thus, Al atoms can migrate only by interfacial or lattice diffusion, which is slower than grain boundary diffusion. Moreover, the short cooling allows the Cu in the Al alloy to stay in solution, where it can readily replenish depleted boundaries.

Figure 2:
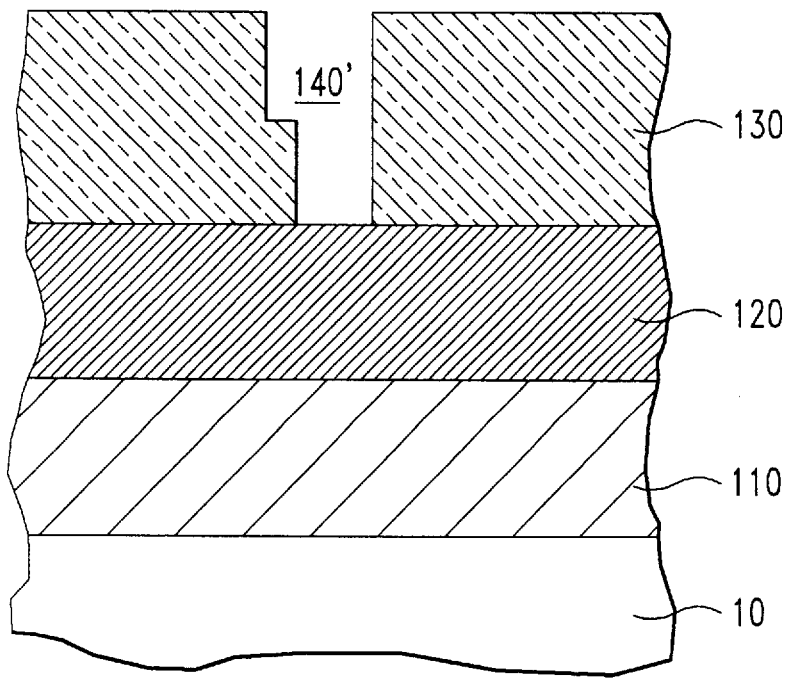
FIG. 2 illustrates a technique in the prior art.

Referring now to FIG. 2, there is shown a similar portion of a circuit part way through a process according to the art. An aperture 140' has been formed by a two-step etching process. In the first step, the same as the inventive process, an aperture has been formed all the way to the surface of metal 120. In a second step, a wider aperture has been defined and a second reactive ion etching step has formed a straight-sided upper area of aperture 140'. This etching is effective, but suffers from the disadvantage that the aperture to be filled in the following metal deposition step has a high aspect ratio and therefore is susceptible to the formation of voids, with the possibility of an incomplete or open circuit.

Figure 3:
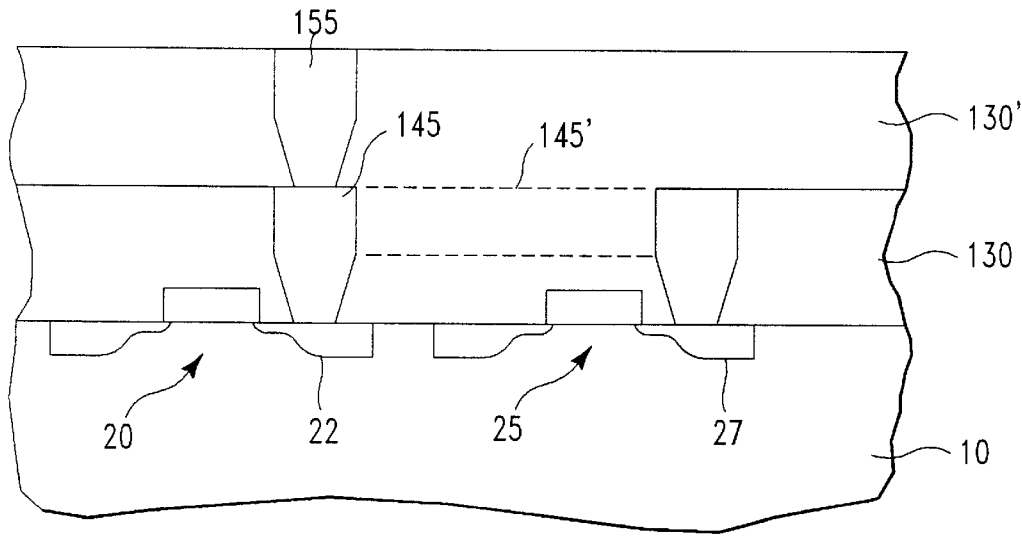
FIG. 3 illustrates a portion of an integrated circuit showing in cross-section Damascene interconnections formed according to the invention.

Referring now to FIG. 3, there is shown a portion of an integrated circuit illustrating the use of the invention. At the bottom of the figure, two transistors 20 and 25 have been formed in substrate 10 by conventional process. One Damascene interconnect 145 has been formed in a first layer of insulator 130 extending down through a via to make contact with source 22. Another portion of interconnect 145 has been formed to connect to source 27 of transistor 25 through another via. An interconnection line 145' out of the plane of the paper connects the two portions 145, the whole being referred to by the generic term "interconnect", referring to a conductive member that may or may not be planar and connects two or more nodes within an integrated circuit. For purposes of illustration, a second layer 130' and a second level of via 155 are shown, illustrating that the invention is suitable for use in a number of metal layers.

Figure 4A:
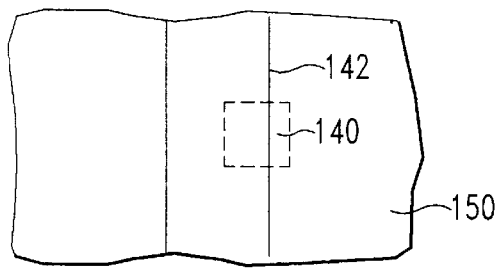
FIGS. 4A, 4B, 5A and 5B illustrate the effect of misalignment between the via and the Damascene layer.
Figure 5A:
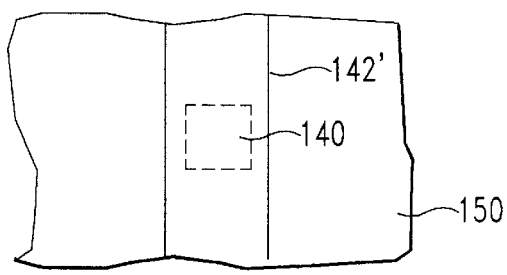
Figure 4B:
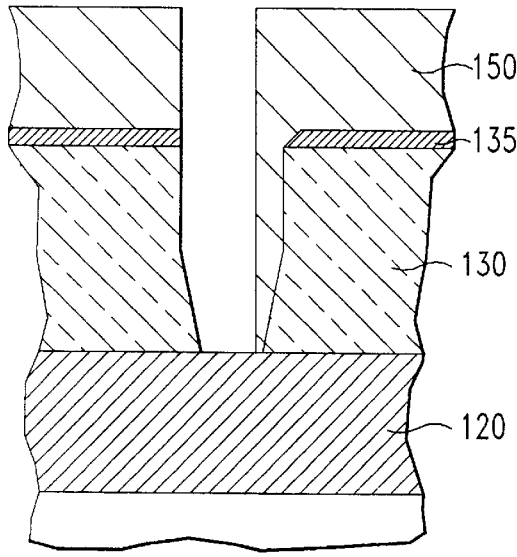
Figure 5B:
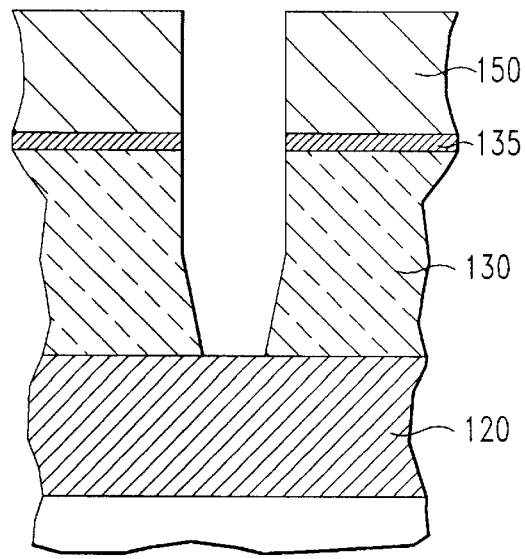

Referring now to FIGS. 4A, 4B, 5A and 5B the effect of misalignment is illustrated in top of cross sectional views. FIG. 4A illustrates in a top view the misalignment shown in FIG. 1 and FIG. 5A illustrates correct alignment between apertures 140 and 142 The effect of misalignment is shown in FIG. 4B as similar to that of FIG. 1C, with the additional feature that the tapered region on the left in FIG. 4B is cut off with a vertical face, while the taper on the right side is protected by photoresist 150 and is not changed. In FIG. 5B, both faces of layer 135 are vertical and both sides of aperture 140 are tapered. This illustrates an additional benefit of the invention—that the apertures are self-aligned and taper is only provided where the design rules are not violated.

Preferably, the wires are isolated and planarized by a chemical-mechanical polish (CMP) using a non-corrosive slurry, in order to eliminate any damage to the interconnects during the CMP operation. The process has been disclosed in the context of an antireflective coating that is used for ultraviolet exposure, but is not confined to that, and any fluid coating having a suitable surface tension may be used, regardless of its reflective properties.

Those skilled in the art will readily appreciate that different embodiments of the invention may be made in view of the enclosed teaching and the following claims are not meant to be limited to the embodiments disclosed.

We claim:

1. A method of forming an integrated circuit comprising the steps of:

preparing a substrate;

forming a plurality of transistors in said substrate; and interconnecting said plurality of transistors with interconnects to form said integrated circuit, in which said step of interconnecting comprises at least one step of forming a damascene metal interconnect in a first dielectric layer, said damascene metal interconnect connecting nodes in said circuit lying below said first dielectric layer by means of conductive vias extending downwardly from said damascene metal interconnect to a lower electrical member, and in which said vias and said damascene metal interconnect are formed by the steps of:

etching a set of first apertures having substantially vertical sides in contact areas of said first dielectric layer;

spinning on a layer of coating on said first dielectric layer, whereby said layer of coating has a set of tapered rim regions about said set of first apertures with a coating taper extending from said apertures to a coating surface outside said rim regions and having a rim slope in said rim regions of said coating;

depositing a layer of photoresist above said layer of coating;

forming a set of second apertures in said layer of photoresist above said set of first apertures and said set of tapered regions;

etching through said second apertures with a non-isotropic etchant that attacks said first dielectric layer at a higher rate than said coating, whereby said first apertures are expanded laterally and said sides of said second apertures are tapered with a taper having a via slope greater in magnitude than said coating slope.

2. A method according to claim 1, in which said set of first apertures extends partially through said first dielectric layer.

3. A method according to claim 2, further comprising the steps of performing a collimated deposition of a first layer of metal in said set of second apertures, followed by a non-collimated deposition of a second layer of metal to fill said set of second apertures.

4. A method according to claim 3, in which said step of non-collimated deposition is performed at a temperature greater than 450° C.

5. A method according to claim 1, in which said set of first apertures extends through said first dielectric layer.

6. A method according to claim 5, further comprising the steps of performing a collimated deposition of a first layer of metal in said set of second apertures, followed by a non-collimated deposition of a second layer of metal to fill said set of second apertures.

7. A method according to claim 6, in which said step of non-collimated deposition is performed at a temperature greater than 450° C.

* * * * *